United States Patent
Khlat

(10) Patent No.: US 11,316,500 B2
(45) Date of Patent: Apr. 26, 2022

(54) BEAMFORMING WITH PHASE CORRECTION

(71) Applicant: Qorvo US, Inc., Greensboro, NC (US)

(72) Inventor: Nadim Khlat, Cugnaux (FR)

(73) Assignee: QORVO US, INC., Greensboro, NC (US)

(*) Notice: Subject to any disclaimer, the term of this patent is extended or adjusted under 35 U.S.C. 154(b) by 0 days.

(21) Appl. No.: 17/186,800

(22) Filed: Feb. 26, 2021

(65) Prior Publication Data

US 2021/0288632 A1 Sep. 16, 2021

Related U.S. Application Data

(60) Provisional application No. 62/988,945, filed on Mar. 13, 2020.

(51) Int. Cl.

| H03F 3/24 | (2006.01) |
|---|---|
| H03M 3/00 | (2006.01) |
| H03F 1/02 | (2006.01) |
| H03F 1/32 | (2006.01) |
| H03H 11/16 | (2006.01) |
| H04B 7/06 | (2006.01) |
| H04B 1/04 | (2006.01) |

(52) U.S. Cl.
CPC ............ H03H 11/16 (2013.01); H03F 3/245 (2013.01); H03M 3/30 (2013.01); H04B 1/04 (2013.01); H04B 7/0617 (2013.01); *H03F 2200/102* (2013.01); *H03F 2200/451* (2013.01)

(58) Field of Classification Search
None
See application file for complete search history.

(56) References Cited

U.S. PATENT DOCUMENTS

| 7,697,903 | B2* | 4/2010 | Behzad | H04W 52/52 |
| | | | | 455/91 |
| 7,873,332 | B2* | 1/2011 | Behzad | H03G 3/3042 |
| | | | | 455/126 |
| 9,866,178 | B2* | 1/2018 | Anderson | H03F 3/45179 |
| 10,177,719 | B2* | 1/2019 | Gazneli | H03F 3/195 |
| 10,270,510 | B1* | 4/2019 | Wang | H04B 1/0064 |
| 10,841,018 | B2* | 11/2020 | Tervo | H04B 1/0475 |
| 10,924,063 | B2* | 2/2021 | Esmael | H03F 1/3205 |

(Continued)

OTHER PUBLICATIONS

Yang, J., "Measurement of Amplitude and Phase Differences Between Two RF Signals by Using Signal Power Detection," IEEE Microwave and Wireless Components Letters, vol. 24, No. 3, Mar. 2014, 3 pages.

*Primary Examiner* — Pablo N Tran
(74) *Attorney, Agent, or Firm* — Withrow & Terranova, P.L.L.C.

(57) ABSTRACT

A transmitter apparatus that performs beamforming with phase correction uses power detectors present between power amplifiers (PAs) and antennas are used to measure power amplitudes on at least two transmission paths. The sum and difference of these amplitudes are then evaluated to determine a phase difference therebetween. A phase of one signal contributing to the sum and difference may be modified until the sum and difference are the same. Based on an amount of phase modification, a correction signal may be sent to a beamforming circuit to provide phase correction during beamforming.

20 Claims, 14 Drawing Sheets

(56) References Cited

U.S. PATENT DOCUMENTS

| | | | |
|---|---|---|---|
| 2006/0217083 A1* | 9/2006 | Braithwaite | H03F 1/3282 |
| | | | 455/114.3 |
| 2011/0006825 A1* | 1/2011 | Fludger | H04L 27/223 |
| | | | 327/243 |
| 2015/0103955 A1* | 4/2015 | Bartram | H04B 1/0475 |
| | | | 375/297 |
| 2018/0006615 A1* | 1/2018 | Halperin | H03F 1/3241 |
| 2020/0266879 A1* | 8/2020 | Chia | H04B 7/15535 |
| 2021/0281219 A1* | 9/2021 | Khlat | H03F 3/19 |

\* cited by examiner

BEAMFORMING WITH PHASE CORRECTION

RELATED APPLICATIONS

This application claims the benefit of U.S. provisional patent application Ser. No. 62/988,945, filed Mar. 13, 2020, the disclosure of which is hereby incorporated herein by reference in its entirety.

FIELD OF THE DISCLOSURE

The technology of the disclosure relates generally to beamforming in wireless communication devices.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as Wi-Fi, long-term evolution (LTE), and fifth-generation new-radio (5G-NR). 5G-NR, in particular, relies on multiple input-multiple output (MIMO) techniques to enable high-bandwidth communication where plural antennas may transmit multiple signals that have been shaped or steered by a beamforming circuit that adjusts relative phases of the signals.

Typical beamforming circuits assume relatively constant impedance at the antennas. However, temperature fluctuations in the circuitry or at the antenna may cause changes of impedance outside the assumed constant impedance tolerances, resulting in variations in the beam steering which may negatively impact performance.

SUMMARY

Aspects disclosed in the detailed description include a transmitter apparatus that performs beamforming with phase correction. In an exemplary aspect, power detectors present between power amplifiers (PAs) and antennas are used to measure power amplitudes on at least two transmission paths. The sum and difference of these amplitudes are then evaluated to determine a phase difference therebetween. A phase of one signal contributing to the sum and difference may be modified until the sum and difference are the same. Based on an amount of phase modification, a correction signal may be sent to a beamforming circuit to provide phase correction during beamforming. With the corrected beamforming, performance may be improved while better complying with cellular standards.

In one aspect, an IC module is disclosed. The IC module comprises a first power detector circuit configured to create a first pre-signal based on a first detected power level. The IC module also comprises an adjustable phase shifter circuit configured to receive the first pre-signal and adjust a phase thereof to form a first signal based on a phase correction control signal. The IC module also comprises a second power detector circuit configured to create a second signal based on a second detected power level. The IC module also comprises a sigma-delta network. The sigma-delta network comprises an input configured to receive the first signal and the second signal. The sigma-delta network also comprises first additive circuitry configured to sum the first signal with the second signal to create a sigma signal. The sigma-delta network also comprises first difference circuitry configured to subtract the second signal from the first signal to create a delta signal. The IC module also comprises a first envelope detector configured to receive the sigma signal and output a first amplitude value. The IC module also comprises a second envelope detector configured to receive the delta signal and output a second amplitude value. The IC module also comprises a phase control circuit coupled to the adjustable phase shifter circuit. The phase control circuit is configured to generate the phase correction control signal based on the first amplitude value and the second amplitude value. The phase control circuit is also configured to output a correction signal.

In another aspect, a transmitter apparatus is disclosed. The transmitter apparatus comprises an intermediate frequency (IF)-to-radio frequency (RF) IC. The IF-to-RF IC comprises upconversion circuitry configured to upconvert an IF signal to an RF signal. The IF-to-RF IC also comprises a phase beamforming circuit coupled to the upconversion circuitry and configured to form a plurality of shaped RF signals from the RF signal. The IF-to-RF IC also comprises a correction circuit coupled to the phase beamforming circuit and configured to provide a beam correction signal to the phase beamforming circuit based on a correction signal. The transmitter apparatus also comprises an IC module. The IC module comprises a first transmission conductor. The IC module also comprises a first power detector circuit coupled to the first transmission conductor and configured to create a first pre-signal. The IC module also comprises an adjustable phase shifter circuit configured to receive the first pre-signal and adjust a phase thereof to form a first signal based on a phase correction control signal. The IC module also comprises a second transmission conductor. The IC module also comprises a second power detector circuit coupled to the second transmission conductor and configured to create a second signal. The IC module also comprises a sigma-delta network. The sigma-delta network comprises an input configured to receive the first signal and the second signal. The sigma-delta network also comprises first additive circuitry configured to sum the first signal with the second signal to create a sigma signal. The sigma-delta network also comprises first difference circuitry configured to subtract the second signal from the first signal to create a delta signal. The IC module also comprises a first envelope detector configured to receive the sigma signal and output a first amplitude value. The IC module also comprises a second envelope detector configured to receive the delta signal and output a second amplitude value. The IC module also comprises a phase control circuit coupled to the adjustable phase shifter circuit. The phase control circuit is configured to generate the phase correction control signal based on the first amplitude value and the second amplitude value. The phase control circuit is also configured to output the correction signal.

In another aspect, an IC module is disclosed. The IC module comprises an adjustable phase shifter circuit configured to receive a first pre-signal from a first power detector circuit and adjust a phase thereof to form a first signal based on a phase correction control signal. The IC module also comprises a sigma-delta network. The sigma-delta network comprises an input configured to receive the first signal and a second signal from a second power detector circuit. The sigma-delta network also comprises first additive circuitry configured to sum the first signal with the second signal to create a sigma signal. The sigma-delta network also comprises first difference circuitry configured to subtract the second signal from the first signal to create a delta signal. The IC module also comprises a phase control circuit coupled to the adjustable phase shifter circuit. The phase control circuit is configured to generate the phase correction control signal and output a correction signal.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1:
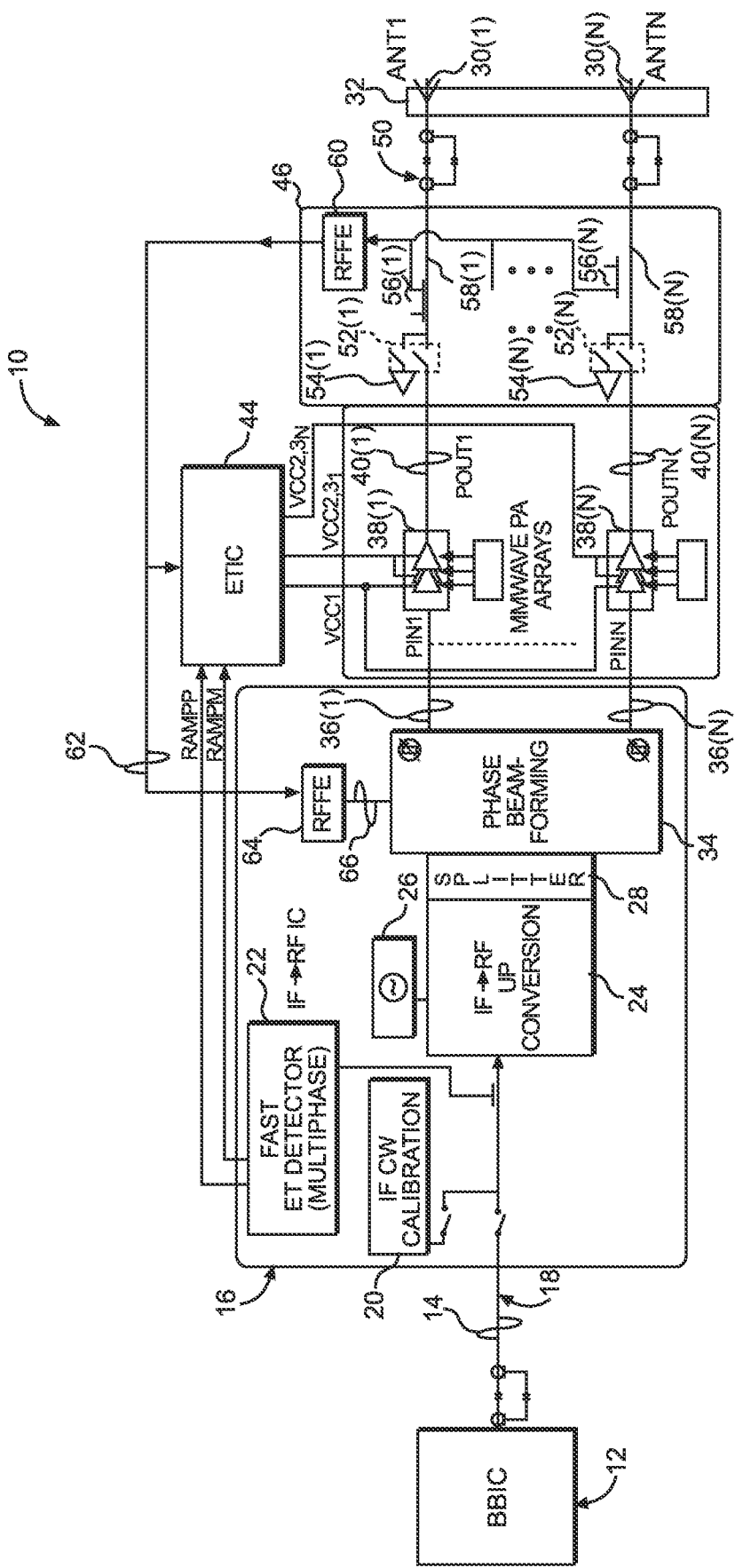
FIG. 1 is a block diagram of a millimeter wave transmitter apparatus having beamforming phase correction circuitry.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a transmitter apparatus that performs beamforming with phase correction. In an exemplary aspect, power detectors present between power amplifiers (PAs) and antennas are used to measure power amplitudes on at least two transmission paths. The sum and difference of these amplitudes are then evaluated to determine a phase difference therebetween. A phase of one signal contributing to the sum and difference may be modified until the sum and difference are the same. Based on an amount of phase modification, a correction signal may be sent to a beamforming circuit to provide phase correction during beamforming. With the corrected beamforming, performance may be improved while better complying with cellular standards.

In this regard, FIG. 1 is a block diagram of an exemplary millimeter wave transmitter apparatus 10. The millimeter wave transmitter apparatus 10 may be positioned in a wireless and/or mobile communication device such as a smart phone, tablet, cellular phone, laptop computer, or the like, and may wirelessly communicate through frequencies (e.g., ~30-300 gigahertz (GHz)) having millimeter wavelengths, such as, for example, those used in fifth-generation new-radio (5G-NR).

To help enable communication, signals to be transmitted are generated in a baseband (BB) integrated circuit (IC) (BBIC) 12, which may be positioned, for example, on a printed circuit board (PCB) or backplane of the mobile communication device. The BBIC 12 may receive baseband signals such as an audio signal from a microphone (not shown) at, for example 20 hertz (Hz)-20 megahertz (MHz), and upconvert the baseband signals to an intermediate frequency (IF) signal (e.g., approximately 10 GHz) as is well understood.

With continued reference to FIG. 1, the BBIC 12 may send IF signals 14 to an IF-to-radio frequency (RF)(IF-to-RF) IC 16 through a link 18. The IF-to-RF IC 16 may be positioned on or in the chassis of the mobile communication device (e.g., on the front or right side is common). Thus, the link 18 may be a coaxial line or other flexible connection.

The IF-to-RF IC 16 includes an IF continuous wave (CW) calibration circuit 20, which is not central to the present disclosure. The IF-to-RF IC 16 also includes a fast envelope tracking (ET) detector circuit 22, which detects the envelope of the IF signal 14 and provides a differential ET signal of Vrampp and Vrampm based thereon as is well understood.

With continued reference to FIG. 1, the IF-to-RF IC 16 includes conversion circuitry 24 which may use a clock source 26 to perform upconversion (and thus is sometimes referred to as upconversion circuitry) from the IF to the radio frequencies used by the wireless communication protocol (e.g., 30-300 GHz). Exemplary clock sources 26 can include a local oscillator (LO), a voltage-controlled oscillator (VCO), a phase-locked loop (PLL), or the like as is well understood. The conversion circuitry 24 may further include a splitter 28, which takes the single upconverted signal and splits it into a number of signals corresponding to a number of antennas 30(1)-30(N) in an antenna array 32. The split signals are provided to a phase beamforming circuit 34, which modifies the phase of each of the split signals to form a desired beam when sent through the antenna array 32. The phase beamforming circuit 34 generates signals 36(1)-36(N) (also referred to as Pin1-PinN in FIG. 1), which are provided to respective power amplifier (PA) arrays 38(1)-38(N) to generate amplified signals 40(1)-40(N) (also referred to as Pout1-PoutN in FIG. 1). As illustrated, each PA array 38(1)-38(N) may include three PAs although more or fewer may be present. The PA arrays 38(1)-38(N) are controlled by voltage signals $Vcc1_1$-$Vcc2,3_1$ through $Vcc1_N$-$Vcc2,3_N$. In this transmitter apparatus 10, some PAs are controlled by the same voltage signal (e.g., a single signal may control the second and third PA in an array). Other control arrangements are possible, such as, for example, each PA having its own dedicated voltage signal, PAs 1 and 2 share a voltage signal, PAs 1 and 3 share a voltage signal, or the like. In some implementations, and as illustrated, PAs in different arrays may have the same control signal, for example each first PA may receive a common signal $Vcc1_1$, while Vcc2,3 may vary depending on the needs of the beamforming.

The Vcc signals are generated by an ETIC 44 based on Vrampp and Vrampm from the ET detector circuit 22. The amplified signals 40(1)-40(N) pass through a power detector module 46, which may be an IC module and will be discussed in greater detail below. The amplified signals 40(1)-40(N) are then provided to the antenna array 32 for transmission through the antennas 30(1)-30(N). A connector 50 may be used to connect the power detector module 46 to the antenna array 32. The connector 50 may include plural coaxial lines or other flexible conductors to couple to the antenna array 32 as the antenna array 32 is frequently in a plane other than the plane of the chassis.

While not the focus of the present disclosure, the antenna array 32 may also receive signals, in which case switches 52(1)-52(N) and low noise amplifiers 54(1)-54(N) may be used to route the received signals to receive circuitry. Conversion circuitry 24 may also perform down conversion on such received signals.

The power detector module 46 includes a plurality of power detector circuits 56(1)-56(N), one each for each transmission conductor 58(1)-58(N), wherein the power detector circuits 56(1)-56(N) are coupled to the respective transmission conductors 58(1)-58(N) and measure an amplitude of signals thereon to create feedback signals. Accordingly, the power detector circuits 56(1)-56(N) may also be referred to as amplitude detection circuits. In conventional systems, the feedback signals are passed to the ETIC 44 to help the ETIC 44 control the power levels of signals being transmitted. The present disclosure reuses and expands on the functionality of these power detector circuits 56(1)-56(N) as explained below.

Note that while coupling power detector circuits 56(1)-56(N) to transmission conductors 58(1)-58(N) is specifically contemplated and may use an RF coupler, other coupling may be used instead. For example, a direct connection to an antenna using a coupler electrically tied to the antenna may be used. Thus, the present disclosure is not specifically limited to coupling to a transmission conductor.

In a perfect world, the transmission conductors 58(1)-58(N), the connector 50, and the antennas 30(1)-30(N) provide a constant impedance and any beamforming done by the phase beamforming circuit 34 is unchanged by amplification in the PA arrays 38(1)-38(N) or passage through the transmission conductors 58(1)-58(N), the connector 50, and the antennas 30(1)-30(N). Unfortunately, the materials forming the transmission conductors 58(1)-58(N), the connector 50, and the antennas 30(1)-30(N) are susceptible to impedance variations as a function of temperature fluctuations and/or other factors. Such impedance variations may introduce phase changes in the signals, where such phase changes distort the formation of the beam, causing the signals to be steered incorrectly. Such incorrect steering may result in degraded performance and/or lack of compliance with the appropriate cellular protocol.

Exemplary aspects of the present disclosure reuse the power detector circuits $56(1)$-$56(N)$ to not only extract amplitude measurements, but also extract relative phase measurements, which are then used to determine if relative phase differences between two signals are correct or if there has been some unintended phase variation such as might have been introduced by temperature fluctuations or the like. Based on the detected relative phase differences, correction signals may be generated and passed back to the phase beamforming circuit 34. The phase beamforming circuit 34 may then compensate or otherwise correct the relative phases during beam formation to provide a desired beam shape.

In particular, the power detector circuits $56(1)$-$56(N)$ may be coupled to a circuit 60 that evaluates the measurements from the power detector circuits $56(1)$-$56(N)$ and uses an adjustable phase shifter and a sigma-delta circuit to ascertain the relative phases of the signals under consideration. A correction signal 62 is generated and sent to a control circuit 64 (also sometimes called a correction circuit) in the IF-to-RF IC 16, which controls the phase beamforming circuit 34 with a beam correction signal 66. More detail about the circuit 60 is provided below with reference to FIGS. 4-9 below.

Figure 2:
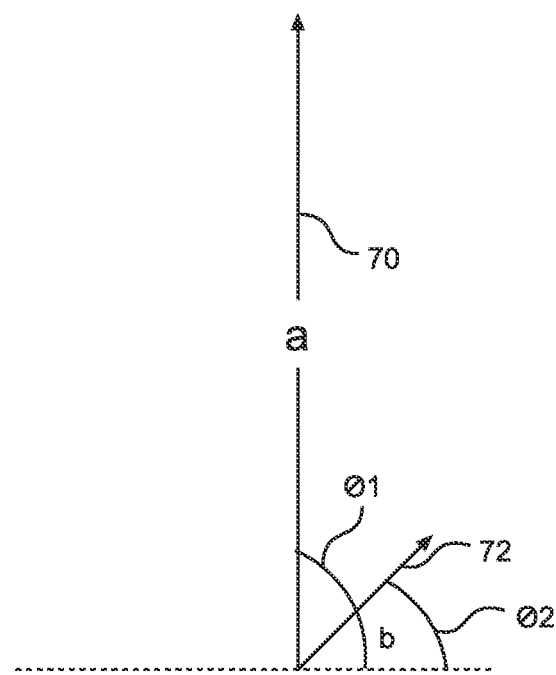
FIG. 2 shows a vector diagram of two exemplary amplitude signals pulled from two transmission paths of the transmitter apparatus of FIG. 1.
Figure 3A:
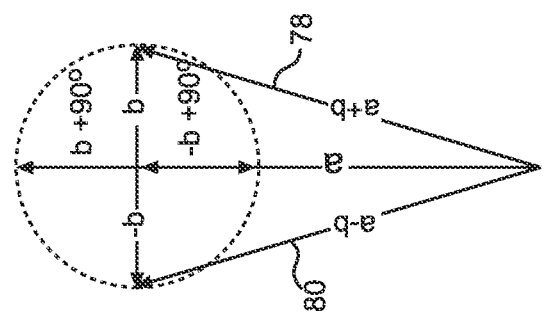
FIGS. 3A and 3B show vector diagrams of a sum and difference of the two exemplary amplitude signals of FIG. 2 when the phases are different and when the phases are identical, respectively.
Figure 3B:
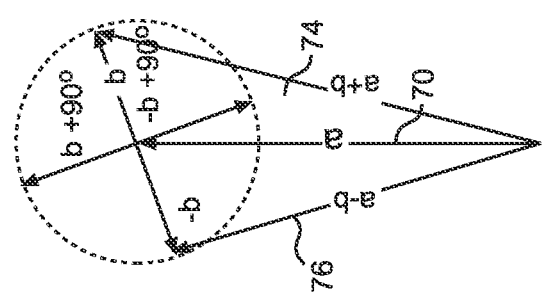

Before addressing the details about the circuit 60, a few observations are provided about the signals provided by the power detector circuits $56(1)$-$56(N)$ with reference to FIGS. 2-3B. FIG. 2 illustrates two vectors 70 and 72, representative of two signals. Vector 70 has an amplitude of a, while vector 72 has an amplitude of b. Vector 70 has a phase angle of $\phi 1$ and vector 72 has a phase angle of $\phi 2$. Of greater interest is the sum and difference of vector 70 and vector 72 as better illustrated in FIG. 3A. In particular, a+b creates vector 74 while a−b creates vector 76 so long as $\phi 1$ does not equal $\phi 2 - 90°$. However, if $\phi 1 = \phi 2 - 90°$, then the sum and difference is provided in FIG. 3B, where a+b creates vector 78 and a−b creates vector 80. In this case, the magnitude or amplitude of vectors 78 and 80 are equal. This relationship is used advantageously by the present disclosure. Specifically, if on initial receipt, the magnitude of the sum and difference signals are not equal, then a phase adjustment may be made until they are equal. The amount of phase adjustment is the amount (+90 degrees) by which the signals are out of phase and this can be used to make sure that the beamforming is not being corrupted by other factors such as temperature fluctuations.

Figure 4:
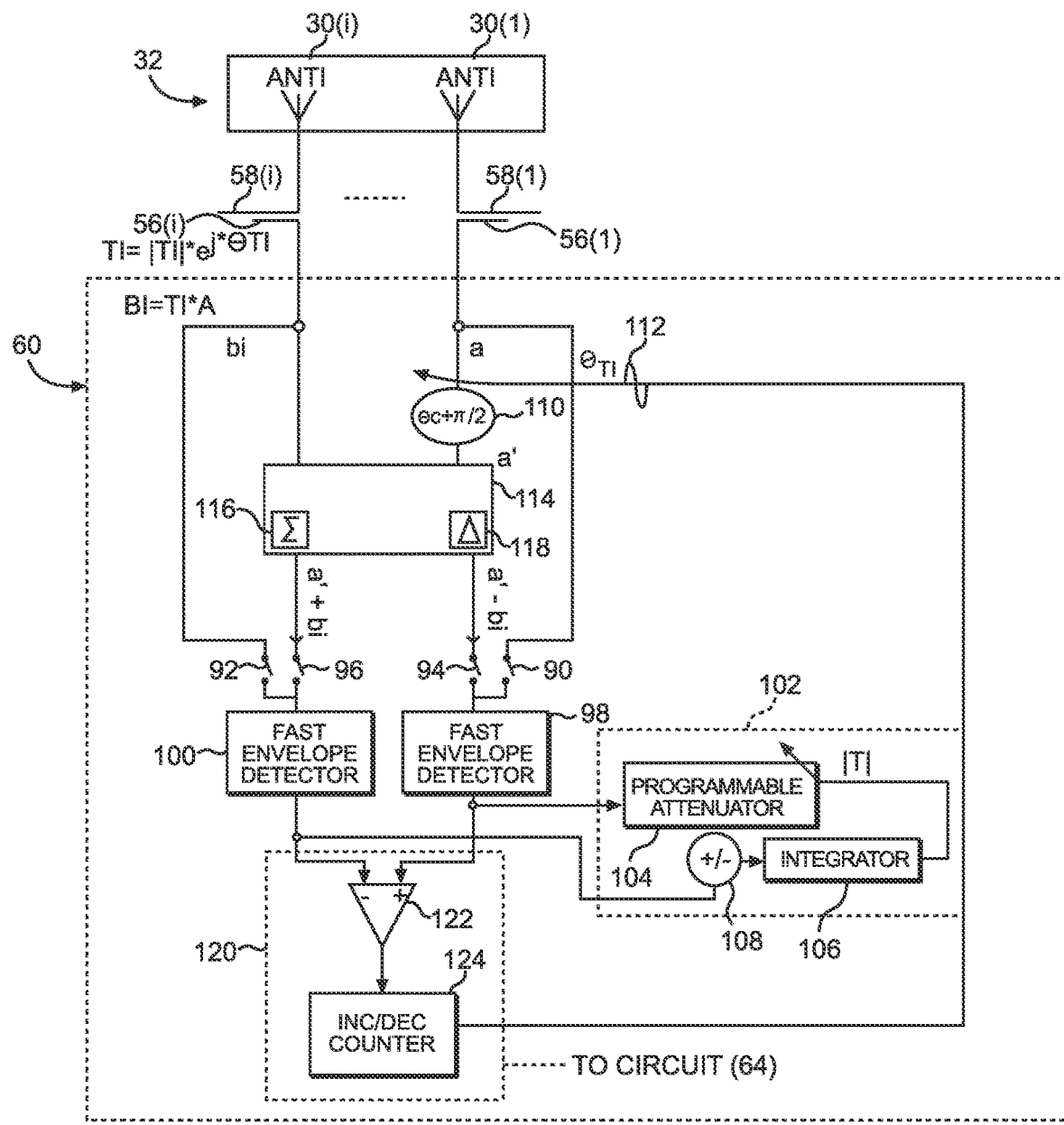
FIG. 4 is a block diagram of an exemplary phase detection circuit module that uses power amplitudes of two signals to detect a relative phase difference between the two signals.

In this regard, FIG. 4 shows details of an exemplary circuit 60 that takes the power amplitude measurements made by the power detector circuits $56(1)$-$56(N)$ from the transmission conductors $58(1)$-$58(N)$ and determines a relative phase shift between two such amplitude measurements. For the purposes of illustration, the measured signal from transmission conductor $58(1)$ is considered to be a reference signal, and is labeled a. The measured signal from transmission conductor $58(i)$ is the signal to be compared to the reference signal and may be expressed as $b_i$. There exists some vector $T_i$ for which the statement $b_i = T_i * a$ where $T_i = |T_i| * e^{j\Theta(Ti)}$.

In a first mode, first switches 90 and 92 are closed and second switches 94 and 96 are open. Collectively, the switches 90 and 94 form a first switch structure, and the switches 92 and 96 form a second switch structure. This configuration of the switches 90, 92, 94, and 96 routes a and $b_i$ directly to a first fast envelope detector 98 and a second fast envelope detector 100, respectively. The fast envelope detectors 98 and 100 measure a and $b_i$ and pass the measured values to an amplitude delta circuit 102 that can determine the relative difference in amplitudes between a and $b_i$ (e.g., can determine $|T_i|$). The amplitude delta circuit 102 can be formed by a programmable attenuator circuit 104, an integrator 106 and a combiner 108. The output of the combiner 108 is provided to the integrator 106, which controls the programmable attenuator circuit 104. The combiner 108 receives signals from the second fast envelope detector 100 and the programmable attenuator circuit 104, with feedback until $|T_i|$ is determined. This relative amplitude difference (i.e., an amplitude signal) may then be output to the ETIC 44 (FIG. 1). Calculation of amplitude differences based on power levels on the transmission conductors $58(1)$-$58(N)$ using fast envelope detectors is used currently and further discussion is omitted.

Exemplary aspects of the present disclosure allow reuse of the fast envelope detectors 98 and 100 to also detect the phase difference between a and $b_i$. In this second mode, switches 90 and 92 are open and switches 94 and 96 are closed. This arrangement of the switches 90, 92, 94, and 96 causes signal a, sometimes referred to as a first pre-signal to be passed to an adjustable phase shifter circuit 110, which adjusts the phase of signal a by $\Pi/2$ or 90° and some value $\Theta_c$ determined by a phase correction control signal 112, also referred to as $\Theta_{Ti}$. Shifting signal a by 90° forms the conjugate of signal a, referred to herein as a', or a first signal (derived from the first pre-signal).

Signals a' and $b_i$ are provided to a sigma-delta network 114. The sigma-delta network 114 includes summation circuitry or additive circuitry 116, which adds the first signal a' with the second signal $b_i$ to create a sigma signal (a'+$b_i$) and difference circuitry 118 that subtracts the second signal $b_i$ from the first signal a' to create a delta signal (a'−$b_i$). More details about the sigma-delta network 114 are provided below with reference to FIGS. 10A-10D. The sigma signal and the delta signal are provided to the second fast envelope detector 100 and the first envelope detector 98, respectively.

In the second mode, the fast envelope detectors 98 and 100 are provided to output first and second amplitude values based on the delta signal and the sigma signal, respectively. The first and second amplitude values are received at a phase control circuit 120, which in this exemplary aspect, may include a comparator 122 and a counter 124 that increments or decrements based on the output of the comparator 122. The phase control circuit 120 generates the phase correction control signal 112 and also outputs a correction signal that is provided to the circuit 64 (FIG. 1).

In use in the second mode, the sigma signal is initially akin to the vector 74 and the delta signal is akin to the vector 76 of FIG. 3A. The fast envelope detectors 98 and 100 extract the amplitudes and provide them to the comparator 122 which provides a positive or negative value to the counter 124.

The amplitudes may be calculated as follows:

$$|a'+b|^2 = |a'|^2 + |b|^2 + (a'b^* + a'^*b)$$

$$|a'-b|^2 = |a'|^2 + |b|^2 - (a'b^* + a'^*b)$$

It is noted that the amplitudes have a common term $|a'|^2 + |b|^2$ and a difference term Diff Env=$(a'b^* + a'^*b)$, which can be expressed as:

$4|a'||b'|\cos(\Theta a'-\Theta b)$, where $a'=|a'|e^{j\Theta a'}$ and $b=|b|e^{j\Theta b}$, which simplifies to $4|a||b'|\cos(\Pi/2+\Theta a'-\Theta b)$ since $\Theta a'=\Theta a+\Pi/2$ The counter 124 outputs the phase correction control signal 112 to the adjustable phase shifter circuit 110, which changes $\Theta_C$ to change a'. Over time, the values of a' and $b_i$ will converge and a relative phase difference $\Theta_C$ will be determined and supplied to the circuit 64. If $\Theta_C$ is not the desired relative phase between the two signals as required by the desired beamforming, adjustments may be made in the beamforming to compensate.

While not shown, it should be appreciated that this comparison can be made sequentially between signals on transmission conductors 58(2)-58(N) by providing appropriate switching circuitry to connect the appropriate power detector circuit 56(i) to the sigma-delta network 114 and adjustments made accordingly. If sequentially stepping through is too slow for compliance with the desired beamforming, then additional duplicative circuitry could be provided to operate in parallel.

Figure 5:
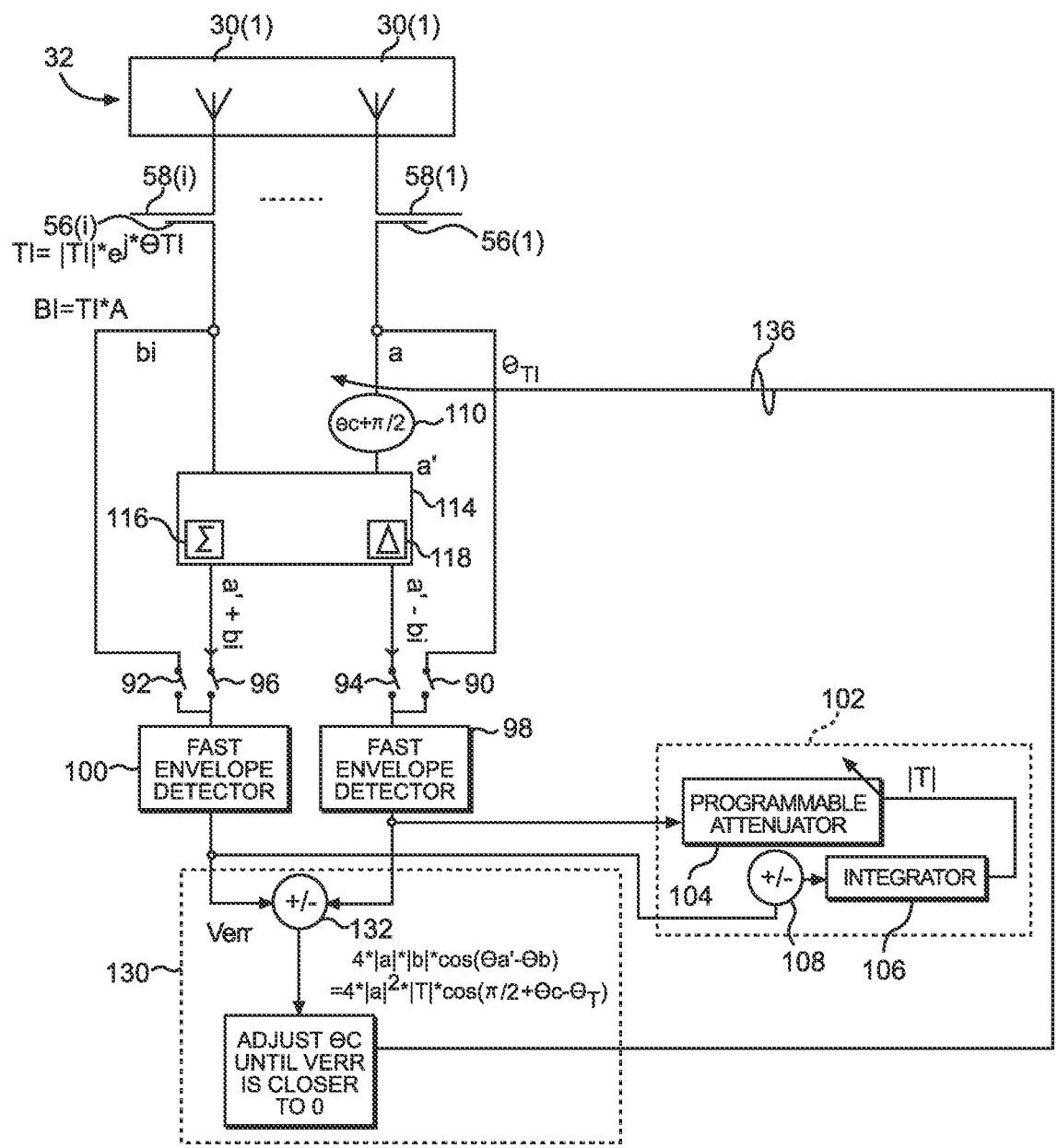
FIG. 5 is a block diagram of an alternate exemplary phase detection circuit module that uses power amplitudes of two signals to detect a relative phase difference between the two signals.

FIG. 5 illustrates an alternate phase control circuit 130 also referred to herein as an error vector generator circuit in place of phase control circuit 120 of FIG. 4. In other aspects, the circuit 60 remains unchanged so duplicative discussion is omitted. The phase control circuit 130 includes a combiner 132 that produces an error vector Verr. An adjustment circuit 134 adjusts $\Theta_C$ until Verr is equal to zero (0). Verr is equal to Diff Env set forth above or:

$$4|a||b'|\cos(\Theta a'-\Theta b)=4|a|^2|T|\cos(\Pi/2+\Theta_C-\Theta_T)$$

Based on Verr, a phase correction control signal 136 or OT is provided to the adjustable phase shifter circuit 110. This aspect has the advantage of potentially more rapidly converging to a desired correction value instead of systemic incremental steps provided by a counter, and larger steps may be taken. However, with the larger steps comes the possibility of more oscillations to either side of the end value. This difference is akin to the difference between an overdamped system and an underdamped system.

Figure 6:
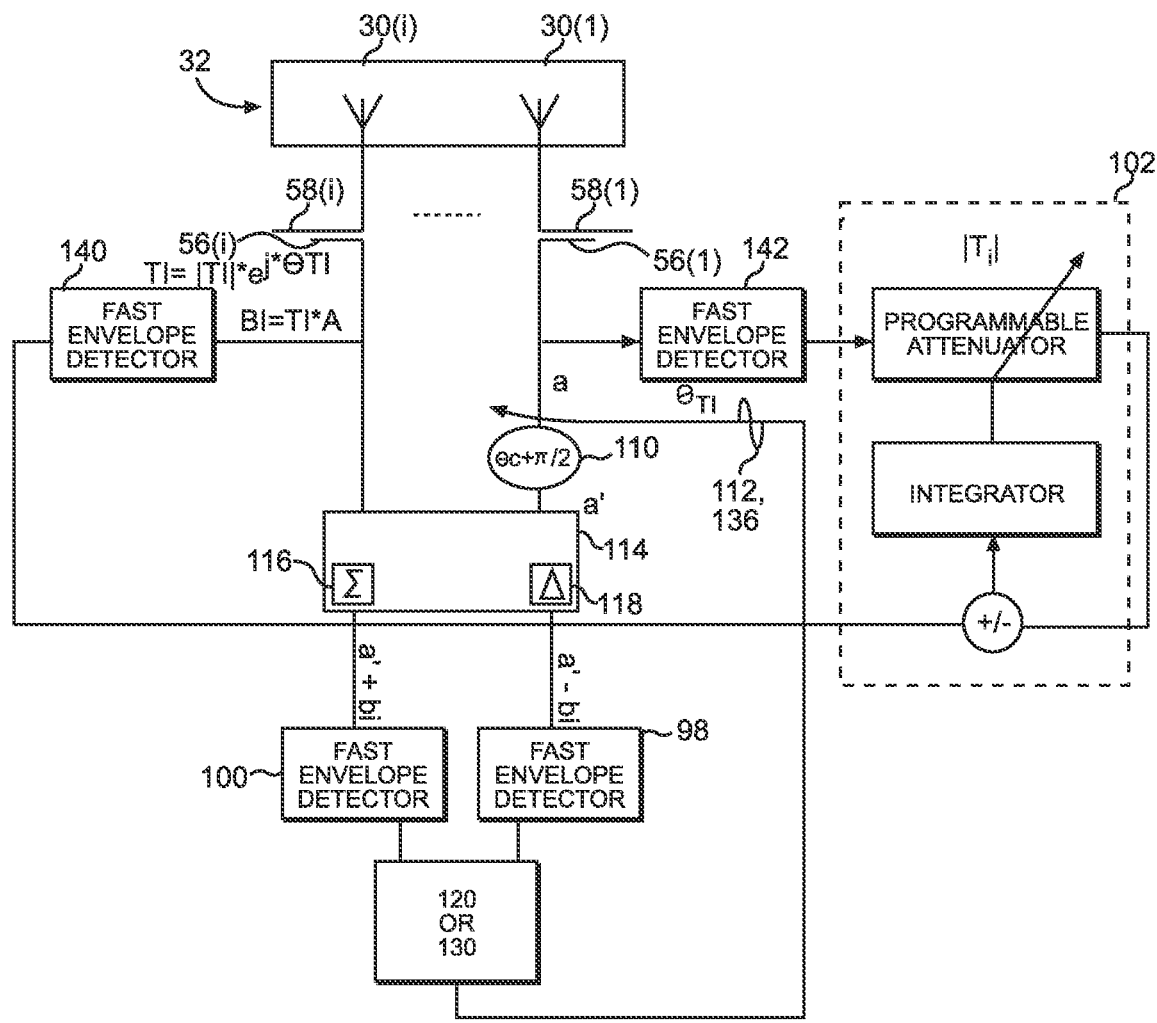
FIG. 6 is a block diagram of another exemplary phase detection circuit module that uses power amplitudes of two signals to detect a relative phase difference between the two signals with additional envelope detectors to determine absolute power levels for the signals.

FIG. 6 provides an alternate aspect which does not reuse the fast envelope detectors 98, 100. Rather, additional fast envelope detectors 140, 142 are provided in parallel. The additional fast envelope detectors 140, 142 provide the signals to the amplitude delta circuit 102, which operates as previously described. This aspect has the advantage of being able to measure amplitude and phase concurrently instead of having to switch between the two measurement modes. However, the area penalty for having the additional envelope detectors is non-trivial.

Figure 7:
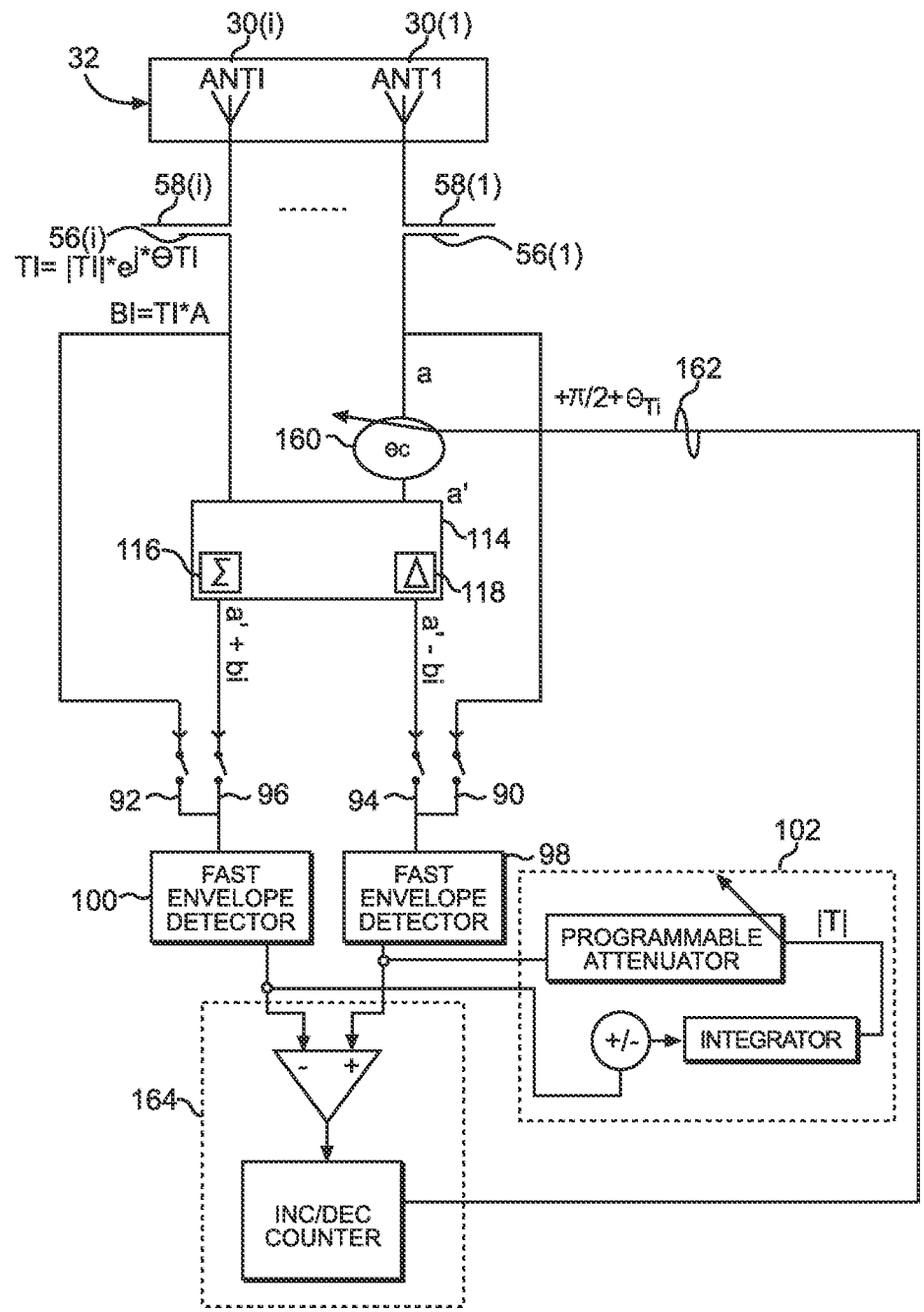
FIG. 7 is a block diagram of another exemplary phase detection circuit module that uses power amplitudes of two signals to detect a relative phase difference between the two signals where a phase adjustment circuit begins adjustment from a zero degree phase difference.

Instead of pre-emptively including the 90 degree phase shift in the adjustable phase shifter circuit 110, it is also possible to include that value in the phase correction control signal 112, 136 that comes from the phase control circuit 120, 130. In this regard, FIG. 7 illustrates a circuit having an adjustable phase shifter circuit 160 that merely adds $\Theta_C$ to the first pre-signal a. However, $\Theta_C$ includes a 90 degree phase shift as well as the correction term $\Theta_B$ in a phase correction signal 162 from a phase control circuit 164. In this regard, the phase control circuit 164 outputs not just the instruction to adjust phase based on the counter, but also includes the instruction to have that phase adjustment further adjusted by the 90 degrees to get the first signal a as described above.

Note that there may be some relative phase shift introduced by the different signal paths that a/a' and b must take before reaching the fast envelope detectors. For example, the addition of the phase adjuster circuit makes the signal path of a/a' longer than the signal path of b. This relative phase difference does not exist between the signals on the transmission conductors 58(1) and 58(i).

Figure 8A:
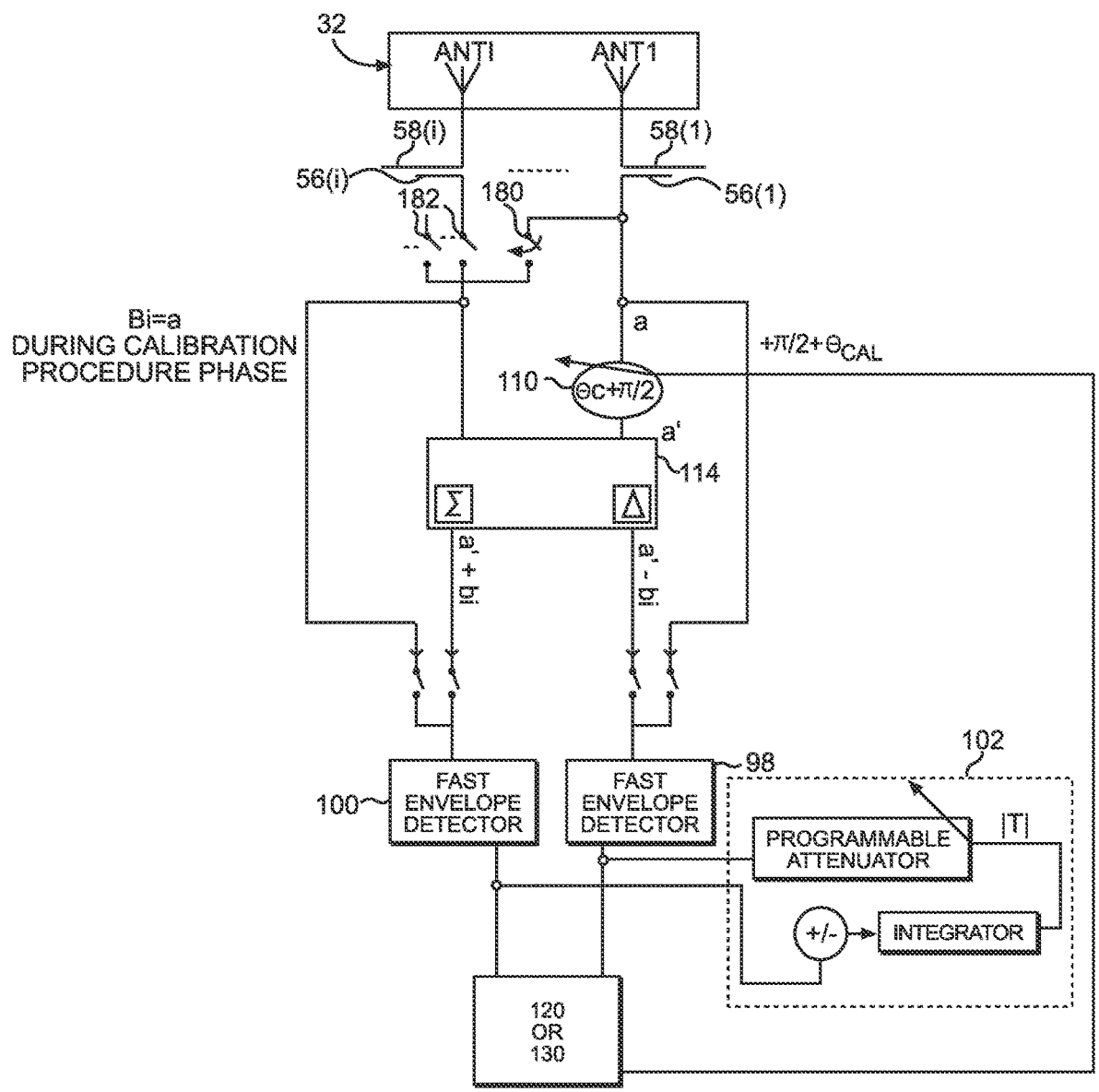
FIG. 8A is a block diagram of another exemplary phase detection circuit module that uses power amplitudes of two signals to detect a relative phase difference between the two signals with a calibration circuit and where the phase adjustment circuit uses a calibration factor during phase adjustment.
Figure 8B:
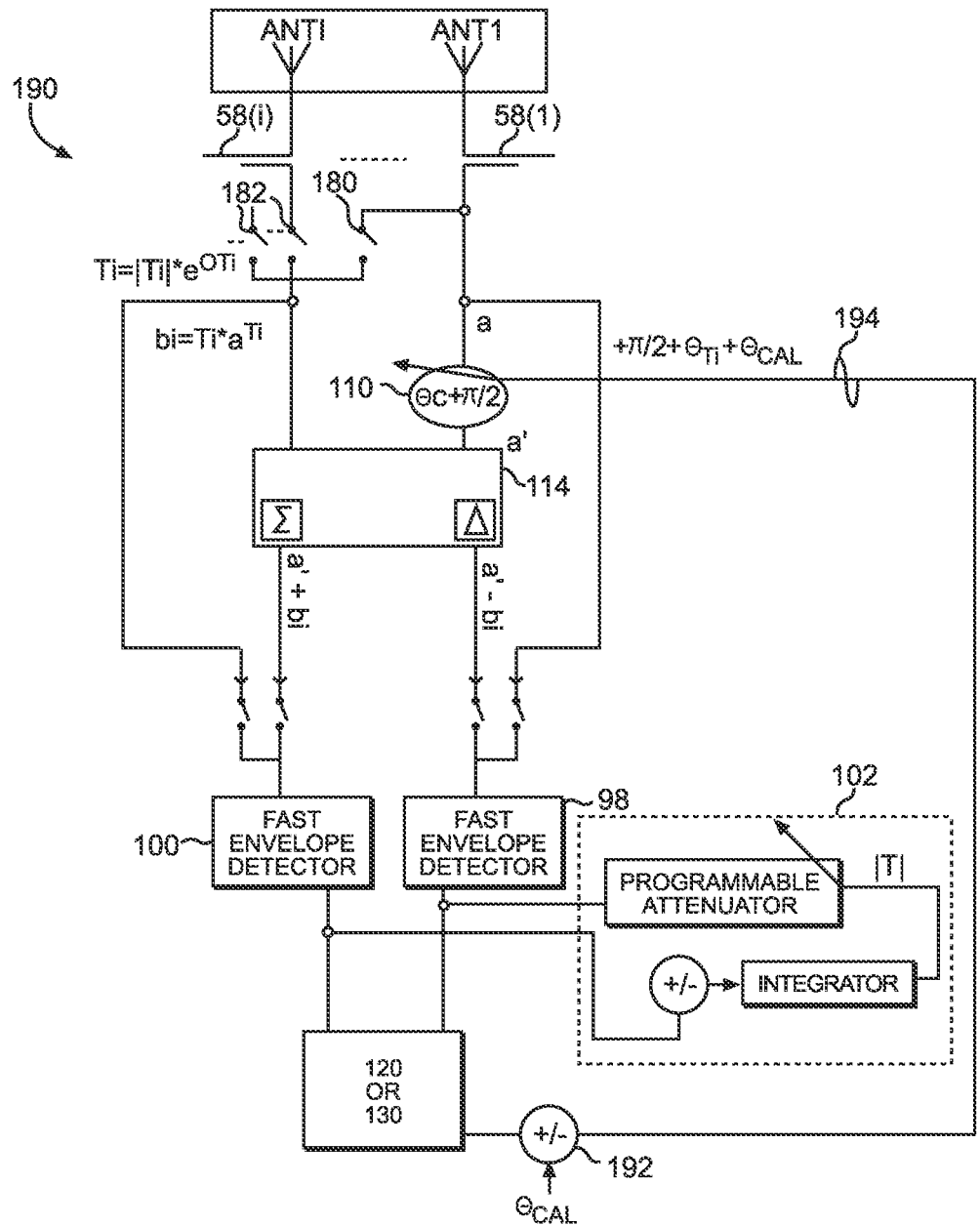
FIG. 8B is a block diagram of another exemplary phase detection circuit module that uses power amplitudes of two signals to detect a relative phase difference between the two signals that includes calibration factors and phase adjustment terms.
Figure 8C:
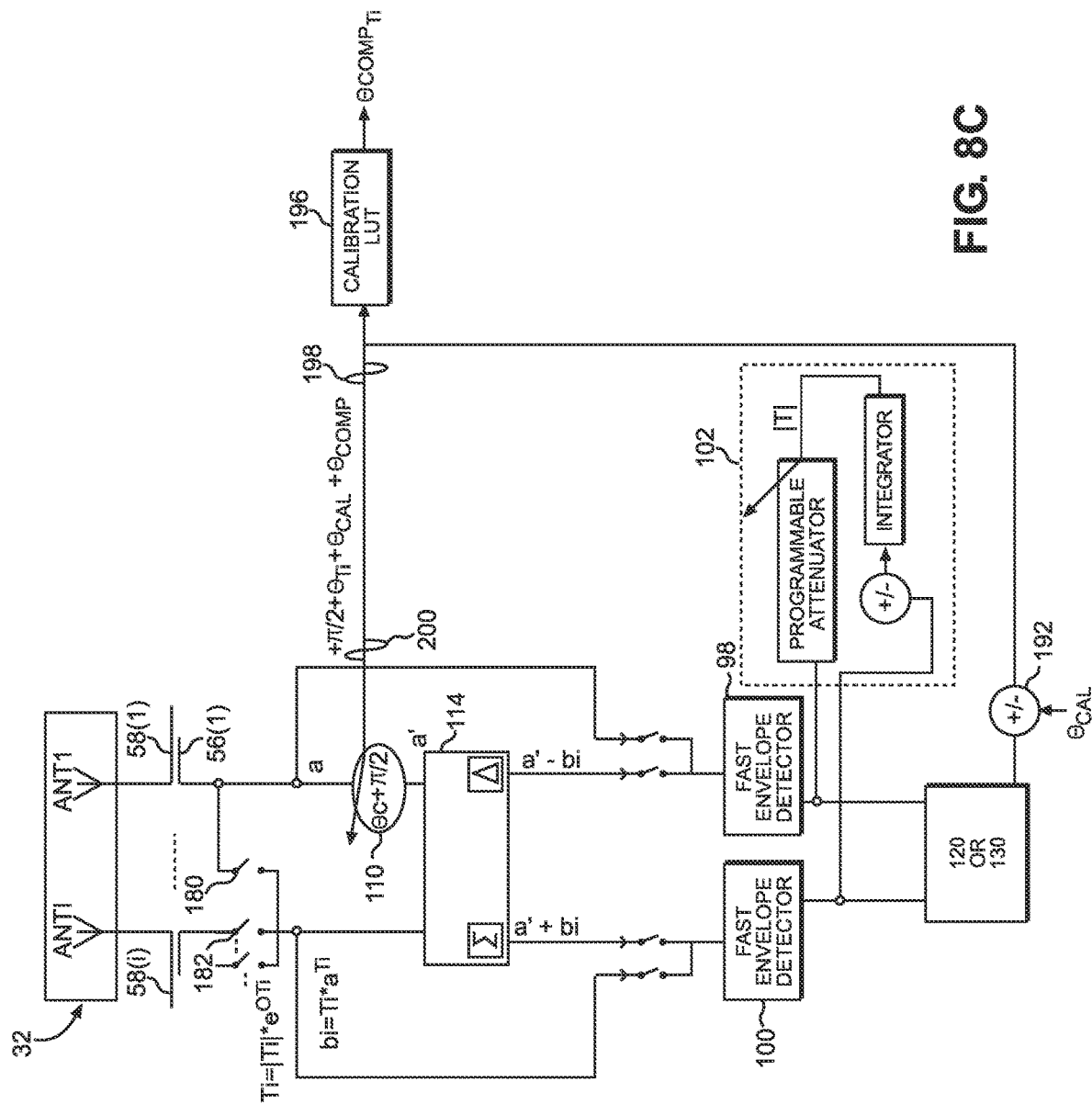
FIG. 8C is a block diagram of another exemplary phase detection circuit module that uses power amplitudes of two signals to detect a relative phase difference between the two signals that includes calibration factors and phase adjustment terms.

Exemplary aspects of the present disclosure allow for pre-emptive compensation for such path-induced phase differences through a calibration step. FIGS. 8A and 8B illustrate how such a calibration may be performed while FIG. 8C illustrates another calibration correction option. In this regard, if a source of signal path length difference is known, the same signal may be routed through both paths and a comparison made therebetween. Thus, as illustrated in FIG. 8A, signal a may be routed to the signal b path by closing switch 180 and opening switch 182. The phase shift introduced by the switch 180 may be known a priori such as by factory specifications or may be tested prior to installation and may be compensated for accordingly. Alternatively, an identical switch may be installed in both signal paths so that they introduce the same phase shift effectively simultaneously. This switch arrangement causes the signal from the power detector circuit 56(1) to go through both paths. The rest of the circuit remains the same and the phase correction term calculated by the phase control circuit 120 or 130 is the calibration term that compensates for signal path distance variations. FIG. 8B illustrates a circuit 190 that includes an adder 192 that adds the calibration term to a control signal 194.

Another possible pre-existing source of phase shift may be non-linearities of the adjustable phase shifter circuit 110. As long as the adjustable phase shifter circuit 110 is monotonic, such non-linearities may be mapped and stored in a look up table (LUT) or the like. In this regard, FIG. 8C illustrates a LUT 196 that provides a compensation signal 198 added to a control signal 200 to compensate for non-linearities of the adjustable phase shifter circuit 110.

Figure 9:
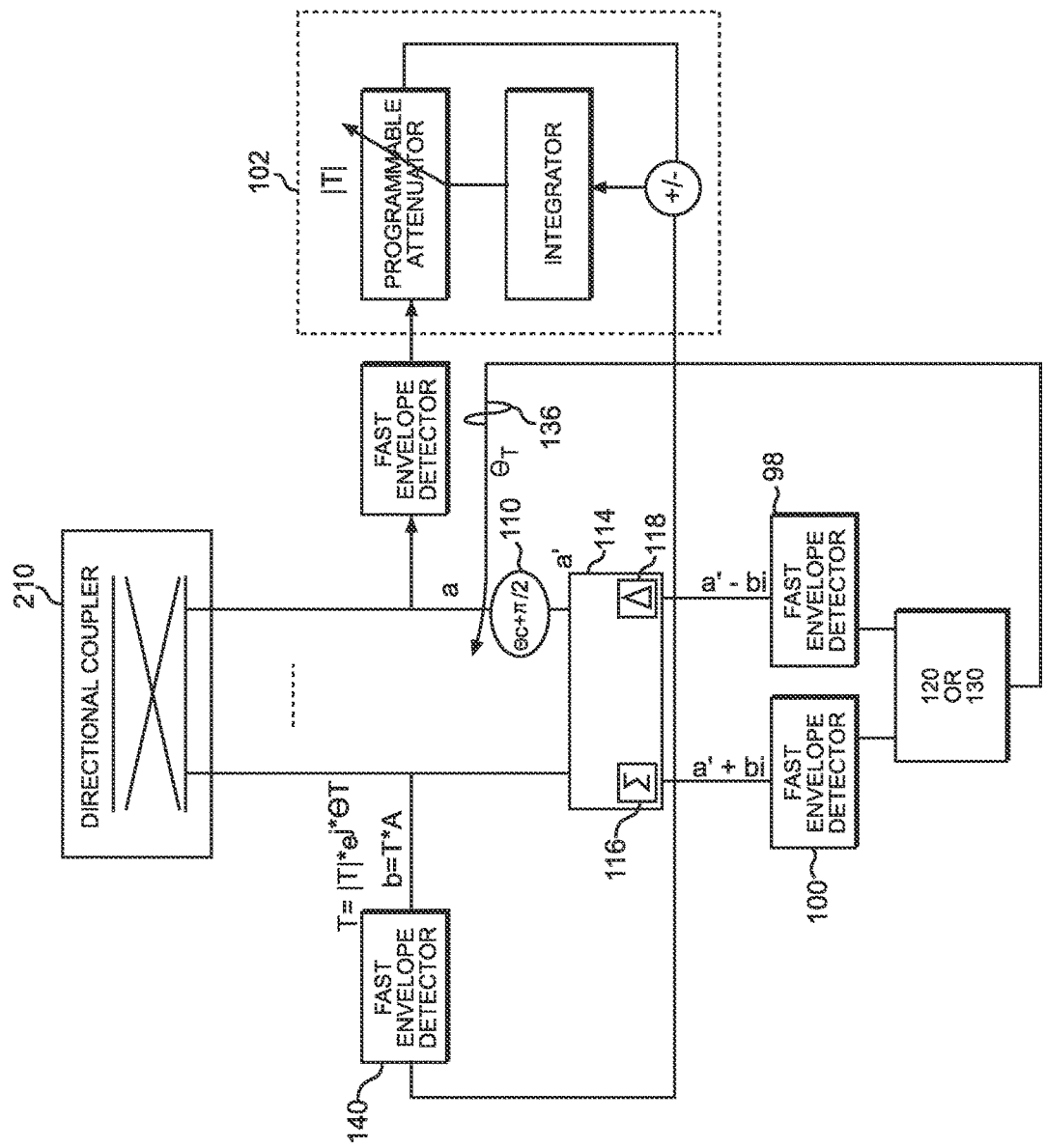
FIG. 9 is a block diagram of another exemplary phase detection circuit module that may be used with a directional coupler rather than a plurality of transmission paths.

While the present disclosure focuses on use in a transmitter apparatus where the signals being measured are signals to be transmitted through an antenna array, the present disclosure is not so limited and may work with other conductors such as those present in a directional coupler as shown in FIG. 9. As illustrated, the circuit is copied from FIG. 6 and is structurally identical thereto. However, the source of the signals is a directional coupler 210.

Figures 10A, 10B:
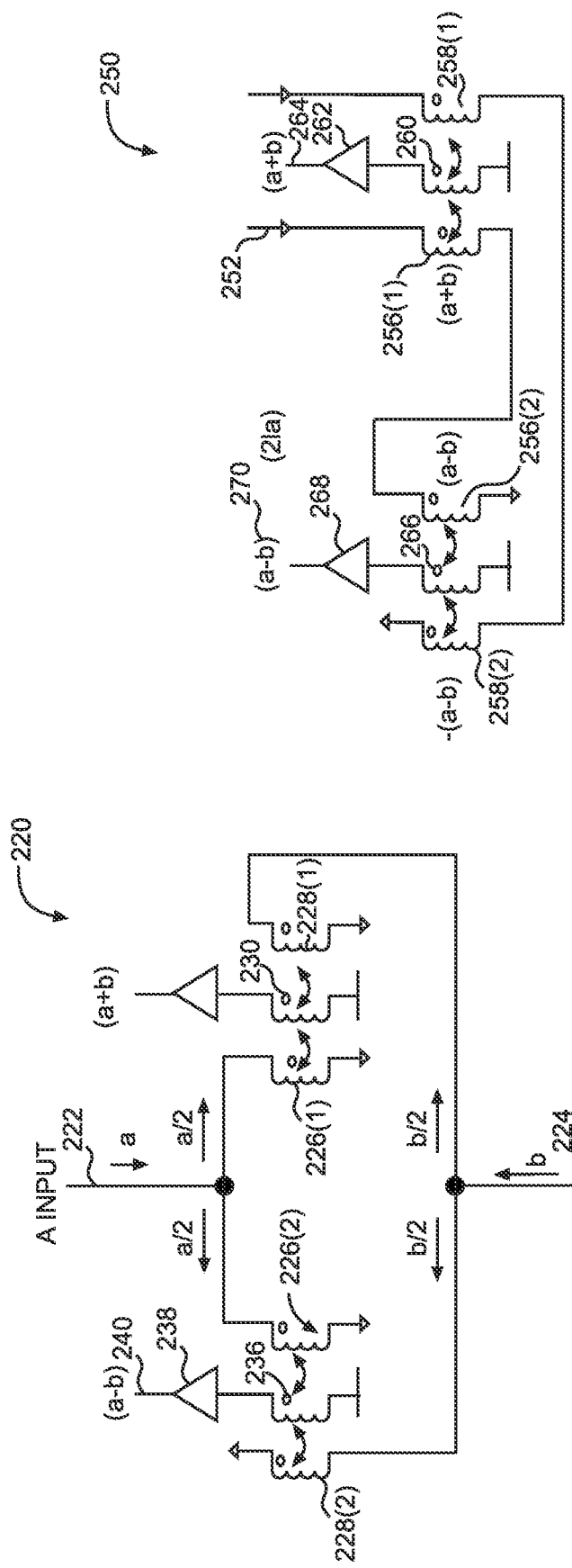
FIGS. 10A-10D illustrate exemplary sigma-delta networks that may be used by various phase detection circuits according to exemplary aspects of the present disclosure.
Figure 10C:
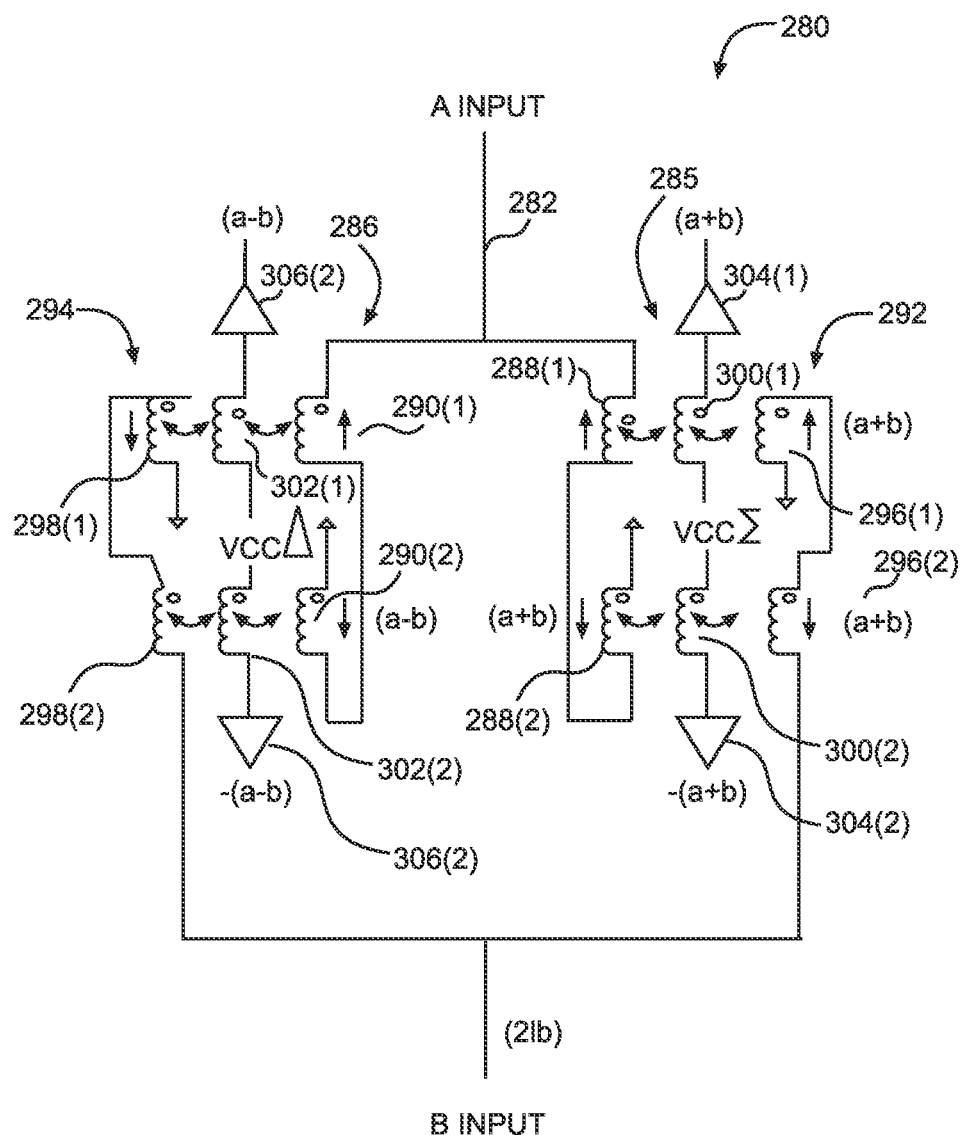
Figure 10D:
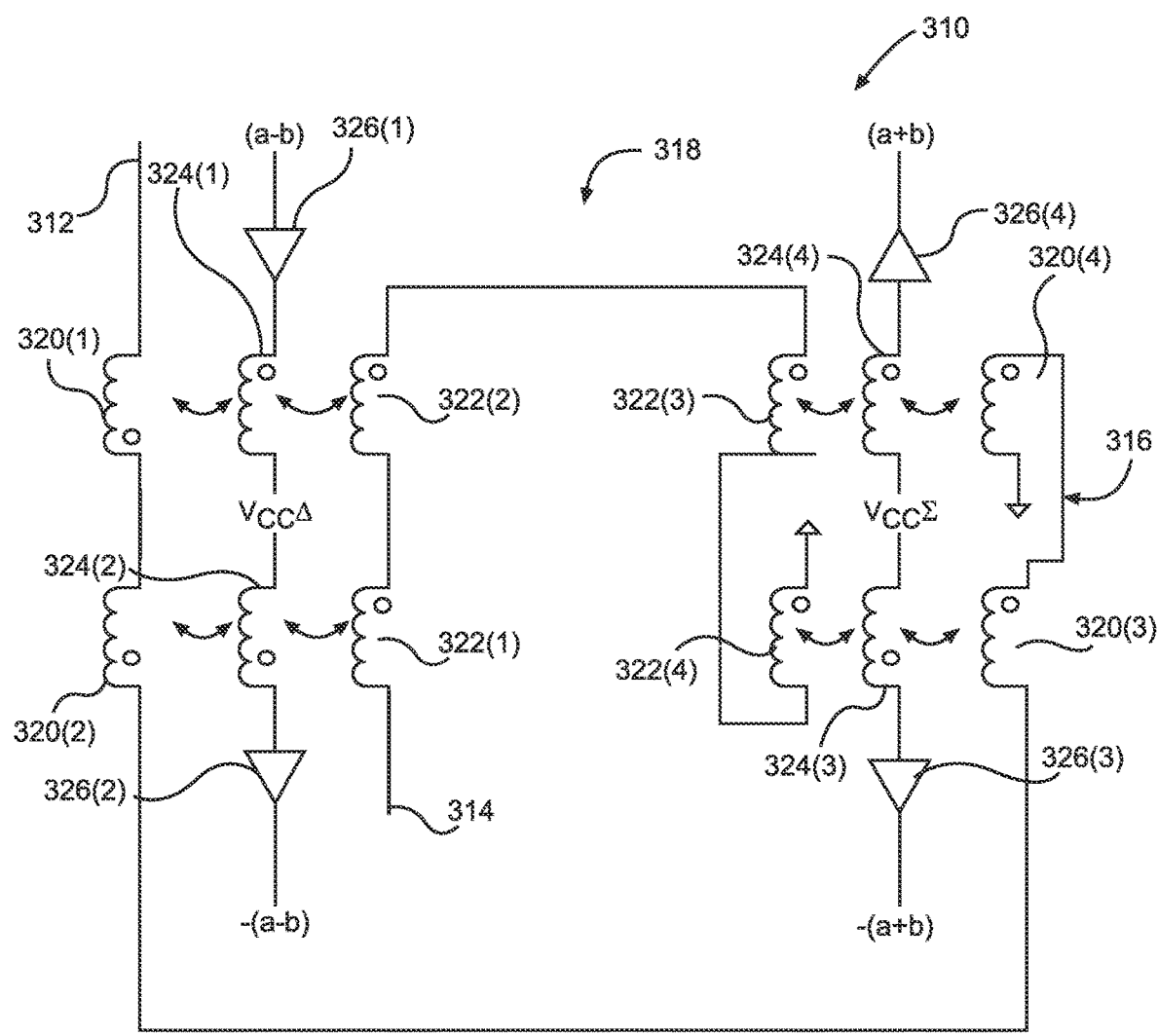

The sigma-delta networks may be single ended (FIGS. 10A and 10B) or differential (FIGS. 10C and 10D) and may sum current (FIGS. 10A and 10C) or sum voltage (FIGS. 10B and 10D). Additionally, power amplifiers may be included if desired.

In this regard, FIG. 10A illustrates a single-ended summed current sigma-delta network 220 (which may be used for the sigma-delta network 114) having a first input 222 to receive the first signal a (which, in the implementations described above, may actually be signal a') and a second input 224 to receive the second signal b. The signal a at the first input 222 divides and passes to parallel inductors 226(1) and 226(2). Similarly, the signal b at the second input 224 divides and passes to parallel inductors 228(1) and 228(2). The inductors 226(1) and 228(1) couple to a first primary inductor 230, effectively summing the first signal a and the second signal b. Note that because of the signal split between inductors 226(1) and 226(2) and between inductors 228(1) and 228(2), the sum may actually be (a/2+b/2). Accordingly, an amplifier 232 is provided to produce a summed signal (a+b) at an output 234. Similarly, the inductors 226(2) and 228(2) couple to a second primary inductor 236. However, the inductor 228(2) is inverted so that the signal b is subtracted from the signal a. Again, because of the signal split, the difference at the second primary inductor 236 may be (a/2–b/2). Accordingly, an amplifier 238 may be provided to produce the difference signal (a–b) at an output 240. These sum and difference signals may then be used as previously described.

While the sigma-delta network 220 sums current, a voltage-summing sigma-delta network 250 is illustrated in FIG. 10B. Again, this sigma-delta network 250 is single ended. In this regard, the sigma-delta network 250 includes a first input 252 and a second input 254. The first input 252 is connected to inductors 256(1) and 256(2) serially. Likewise, the second input 254 is connected to inductors 258(1) and 258(2) serially. The inductors 256(1) and 258(1) couple to a first primary inductor 260 to create a summed signal. The summed signal is amplified by an amplifier 262 to provide (a+b) at an output 264. Similarly, the inductors 256(2) and 258(2) couple to a second primary inductor 266 to create a difference signal. The difference signal is amplified by an amplifier 268 to provide (a–b) at an output 270.

FIGS. 10C and 10D are similar in that they provide current-summing and voltage-summing sigma-delta networks, but for differential signals instead of single-ended signals. In this regard, FIG. 10C illustrates a sigma-delta network 280 that has a first input 282 and a second input 284. The first input 282 is coupled to a first inductor path 285 and a second inductor path 286 in parallel. The first inductor path 285 includes inductors 288(1) and 288(2) in series, and the second inductor path 286 includes inductors 290(1) and 290(2) in series. Similarly, the second input 284 is coupled to a first inductor path 292 and a second inductor path 294 in parallel. The first inductor path 292 includes inductors 296(1) and 296(2) in series, and the second inductor path 294 includes inductors 298(1) and 298(2) in series. The inductors 288(1) and 296(1) couple to an inductor 300(1), and the inductors 288(2) and 296(2) couple to an inductor 300(2). Similarly, the inductors 290(1) and 298(1) couple to an inductor 302(1), and the inductors 290(2) and 298(2) couple to an inductor 302(2). Amplifiers 304(1) and 304(2) are coupled to the inductors 300(1) and 300(2) to provide a first differential output, and amplifiers 306(1) and 306(2) are coupled to the inductors 302(1) and 302(2) to provide a second differential output.

FIG. 10D illustrates a sigma-delta network 310 that has a first input 312 and a second input 314. The first input 312 is coupled to a first inductor path 316. The first inductor path 316 includes inductors 320(1)-320(4) in series. Similarly, the second input 314 is coupled to a second inductor path 318. The second inductor path 318 includes inductors 322(1)-322(4) in series. The inductors 320(1) and 322(2) couple to an inductor 324(1); the inductors 320(2) and 322(1) couple to an inductor 324(2); inductors 320(3) and 322(4) couple to an inductor 324(3); and inductors 320(4) and 322(3) couple to an inductor 324(4). Amplifiers 326(1)-326(4) couple to respective inductors 324(1)-324(4) and provide differential outputs.

Those skilled in the art will recognize improvements and modifications to the embodiments of the present disclosure. All such improvements and modifications are considered within the scope of the concepts disclosed herein and the claims that follow.

What is claimed is:

1. An integrated circuit (IC) module comprising:
   a first power detector circuit configured to create a first pre-signal based on a first detected power level;
   an adjustable phase shifter circuit configured to receive the first pre-signal and adjust a phase thereof to form a first signal based on a phase correction control signal;
   a second power detector circuit configured to create a second signal based on a second detected power level;
   a sigma-delta network comprising:
      an input configured to receive the first signal and the second signal;
      first additive circuitry configured to sum the first signal with the second signal to create a sigma signal; and
      first difference circuitry configured to subtract the second signal from the first signal to create a delta signal;
   a first envelope detector configured to receive the sigma signal and output a first amplitude value;
   a second envelope detector configured to receive the delta signal and output a second amplitude value; and
   a phase control circuit coupled to the adjustable phase shifter circuit and configured to:
      generate the phase correction control signal based on the first amplitude value and the second amplitude value; and
      output a correction signal.

2. The IC module of claim 1, wherein the adjustable phase shifter circuit adds a sum of a 90 degree phase shift and a value determined by the phase correction control signal.

3. The IC module of claim 1, wherein the adjustable phase shifter circuit adds a sum of a 90 degree phase shift, a value determined by the phase correction control signal, and a calibration factor.

4. The IC module of claim 1, wherein the phase control circuit comprises a comparator and a counter.

5. The IC module of claim 1, wherein the phase control circuit comprises a summation circuit and an error vector generator circuit.

6. The IC module of claim 1, further comprising a first switch structure comprising a first two switches configured to allow the first pre-signal to bypass the sigma-delta network and a second switch structure comprising a second two switches configured to allow the second signal to bypass the sigma-delta network.

7. The IC module of claim 6, further comprising an amplitude detection circuit coupled to the first envelope detector and the second envelope detector.

8. The IC module of claim 1, further comprising:
   a third envelope detector configured to receive the first pre-signal;
   a fourth envelope detector configured to receive the second signal; and
   an amplitude detection circuit coupled to the third and fourth envelope detectors.

9. The IC module of claim 1, further comprising a plurality of transmission conductors, at least one first transmission conductor coupled to the first power detector circuit and at least one second transmission conductor coupled to the second power detector circuit.

10. The IC module of claim 9, further comprising a further plurality of power detector circuits corresponding to respective ones of others of the plurality of transmission conductors.

11. The IC module of claim 10, wherein the sigma-delta network may be selectively coupled to power detector circuits selected from the first power detector circuit, the second power detector circuit, and the further plurality of power detector circuits.

12. A transmitter apparatus comprising:
   an intermediate frequency (IF)-to-radio frequency (RF) integrated circuit (IC) comprising:
      upconversion circuitry configured to upconvert an IF signal to an RF signal;

a phase beamforming circuit coupled to the upconversion circuitry and configured to form a plurality of shaped RF signals from the RF signal; and a correction circuit coupled to the phase beamforming circuit and configured to provide a beam correction signal to the phase beamforming circuit based on a correction signal; and an IC module comprising:
a first transmission conductor;
a first power detector circuit coupled to the first transmission conductor and configured to create a first pre-signal;
an adjustable phase shifter circuit configured to receive the first pre-signal and adjust a phase thereof to form a first signal based on a phase correction control signal;
a second transmission conductor;
a second power detector circuit coupled to the second transmission conductor and configured to create a second signal;
a sigma-delta network comprising:
an input configured to receive the first signal and the second signal;
first additive circuitry configured to sum the first signal with the second signal to create a sigma signal; and
first difference circuitry configured to subtract the second signal from the first signal to create a delta signal;
a first envelope detector configured to receive the sigma signal and output a first amplitude value;
a second envelope detector configured to receive the delta signal and output a second amplitude value; and
a phase control circuit coupled to the adjustable phase shifter circuit and configured to:
generate the phase correction control signal based on the first amplitude value and the second amplitude value; and
output the correction signal.

13. The transmitter apparatus of claim 12, further comprising a plurality of power amplifiers coupled to the phase beamforming circuit and the first and second transmission conductors.

14. The transmitter apparatus of claim 12, further comprising an envelope tracking IC (ETIC) further configured to receive an amplitude signal from the IC module.

15. The transmitter apparatus of claim 12, wherein the adjustable phase shifter circuit adds a sum of a 90 degree phase shift and a value determined by the phase correction control signal.

16. The transmitter apparatus of claim 12, wherein the adjustable phase shifter circuit adds a sum of a 90 degree phase shift, a value determined by the phase correction control signal, and a calibration value.

17. The transmitter apparatus of claim 12, wherein the phase control circuit comprises a comparator and a counter.

18. The transmitter apparatus of claim 12, wherein the phase control circuit comprises a summation circuit and an error vector generator circuit.

19. The transmitter apparatus of claim 12, further comprising an amplitude detection circuit coupled to the first envelope detector and the second envelope detector.

20. An integrated circuit (IC) module comprising:
an adjustable phase shifter circuit configured to receive a first pre-signal from a first power detector circuit and adjust a phase thereof to form a first signal based on a phase correction control signal;
a sigma-delta network comprising:
an input configured to receive the first signal and a second signal from a second power detector circuit;
first additive circuitry configured to sum the first signal with the second signal to create a sigma signal; and
first difference circuitry configured to subtract the second signal from the first signal to create a delta signal; and
a phase control circuit coupled to the adjustable phase shifter circuit and configured to:
generate the phase correction control signal; and
output a correction signal.

* * * * *